(12) United States Patent
Chung et al.

(10) Patent No.: US 12,525,585 B2
(45) Date of Patent: Jan. 13, 2026

(54) SEMICONDUCTOR PACKAGE INCLUDING SUB-PACKAGE

(71) Applicant: SAMSUNG ELECTRONICS CO., LTD., Suwon-si (KR)

(72) Inventors: Hyunsoo Chung, Hwaseong-si (KR); Daewoo Kim, Seongnam-si (KR); Younglyong Kim, Anyang-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 694 days.

(21) Appl. No.: 17/850,488

(22) Filed: Jun. 27, 2022

(65) Prior Publication Data

US 2023/0111207 A1 Apr. 13, 2023

(30) Foreign Application Priority Data

Oct. 8, 2021 (KR) .................. 10-2021-0134473

(51) Int. Cl.
*H01L 25/10* (2006.01)
*H01L 23/00* (2006.01)
(Continued)

(52) U.S. Cl.
CPC ........ *H01L 25/105* (2013.01); *H01L 23/3128* (2013.01); *H01L 23/3135* (2013.01);
(Continued)

(58) Field of Classification Search
CPC . H01L 23/5389; H01L 25/50; H01L 23/3128; H01L 25/105; H01L 25/0657;
(Continued)

(56) References Cited

U.S. PATENT DOCUMENTS 8,476,111 B2 7/2013 Cho et al.
9,165,897 B2 * 10/2015 Lee ................ H01L 25/0657
(Continued)

FOREIGN PATENT DOCUMENTS

KR 10-2011-0099555 A 9/2011
KR 10-2014-0057992 A 5/2014

OTHER PUBLICATIONS

Office Action in Korean Appln. No. 10-2021-0134473, mailed on Oct. 16, 2025, 19 pages (with English translation).

*Primary Examiner* — Jaehwan Oh
(74) *Attorney, Agent, or Firm* — Fish & Richardson P.C.

(57) ABSTRACT

A semiconductor package includes; a redistribution wiring layer, a controller chip centrally disposed on the redistribution wiring layer, a first sealant disposed on the redistribution wiring layer, wherein the controller chip is buried in the first sealant, through vias connected to the redistribution wiring layer through the first sealant, and a sub-package disposed on an upper surface of the first sealant. The sub-package may include a first stack structure disposed to one side of the controller chip on the upper surface of the first sealant and including vertically stacked chips, a second stack structure disposed to another side of the controller chip on the upper surface of the first sealant adjacent to the first stack structure in a first horizontal direction and including vertically stacked chips, and a second sealant sealing the first stack structure and the second stack structure.

20 Claims, 11 Drawing Sheets

(51) Int. Cl.
*H01L 23/31* (2006.01)
*H01L 23/29* (2006.01)

(52) U.S. Cl.
CPC .............. *H01L 24/16* (2013.01); *H01L 24/32* (2013.01); *H01L 24/33* (2013.01); *H01L 24/48* (2013.01); *H01L 24/73* (2013.01); *H01L 23/295* (2013.01); *H01L 2224/16225* (2013.01); *H01L 2224/3201* (2013.01); *H01L 2224/32145* (2013.01); *H01L 2224/32225* (2013.01); *H01L 2224/3303* (2013.01); *H01L 2224/48147* (2013.01); *H01L 2224/48148* (2013.01); *H01L 2224/48229* (2013.01); *H01L 2224/73253* (2013.01); *H01L 2224/73265* (2013.01); *H01L 2225/06506* (2013.01); *H01L 2225/0651* (2013.01); *H01L 2225/06524* (2013.01); *H01L 2225/06548* (2013.01); *H01L 2225/06562* (2013.01); *H01L 2225/06589* (2013.01); *H01L 2225/1023* (2013.01); *H01L 2225/1041* (2013.01); *H01L 2225/1058* (2013.01); *H01L 2924/1431* (2013.01); *H01L 2924/1438* (2013.01); *H01L 2924/1811* (2013.01); *H01L 2924/182* (2013.01); *H01L 2924/186* (2013.01)

(58) Field of Classification Search
CPC ................. H01L 25/0655; H01L 24/19; H01L 2225/1058; H01L 2224/32145
See application file for complete search history.

(56) References Cited

U.S. PATENT DOCUMENTS

| | | | |
|---|---|---|---|
| 10,903,190 | B2 | 1/2021 | Kim et al. |
| 10,998,290 | B2* | 5/2021 | Watanabe ............... H01L 24/96 |
| 2014/0124956 | A1* | 5/2014 | Lee .......................... H01L 24/17 257/777 |
| 2016/0329299 | A1 | 11/2016 | Lin et al. |
| 2017/0069564 | A1 | 3/2017 | Kwon et al. |
| 2019/0164948 | A1* | 5/2019 | Chang Chien ........ H01L 21/486 |
| 2019/0326223 | A1* | 10/2019 | Lee ...................... H01L 23/3107 |
| 2020/0203325 | A1 | 6/2020 | Lee et al. |
| 2020/0273784 | A1* | 8/2020 | Mallik ................ H01L 23/5389 |
| 2020/0411496 | A1* | 12/2020 | Zhang ................. H01L 25/0657 |
| 2021/0118852 | A1 | 4/2021 | Fay et al. |
| 2021/0183843 | A1* | 6/2021 | Arifeen ................... H01L 25/18 |
| 2022/0059502 | A1* | 2/2022 | Yamashita .............. H01L 23/04 |

* cited by examiner

SEMICONDUCTOR PACKAGE INCLUDING SUB-PACKAGE

CROSS-REFERENCE TO RELATED APPLICATION

This application claims priority under 35 U.S.C. § 119 to Korean Patent Application No. 10-2021-0134473 filed on Oct. 8, 2021 in the Korean Intellectual Property Office, the subject matter of which is hereby incorporated by reference in its entirety.

BACKGROUND

The inventive concept relates generally to semiconductor packages, and more particularly, to semiconductor packages including a structure on which a plurality of chips is stacked.

As the electronics industry advances and user performance demands increase, the functionality of electronic devices has expanded, while their physical size has decreased. And as electronic devices become smaller and lighter, so too must constituent semiconductor devices.

Accordingly, contemporary and emerging semiconductor devices are expected to provide high performance capabilities, increased data storage capacity, and/or improved overall reliability. Such expanded performance requirements tend to increase the size (e.g., thickness) of semiconductor packages associated with the semiconductor devices, and increased size impedes continuing efforts at miniaturization. Further, such expanded performance requirements tend to increase an amount of electrical power consumed by the semiconductor device, and greater power requirements may adversely affect the reliability of the semiconductor devices.

SUMMARY

Embodiments of the inventive concept provide semiconductor packages having a structure characterized by reduce thickness, yet better configured to respond to increases in power requirements.

According to one aspect of the inventive concept, there is provided a semiconductor package including; a supporting plane, a controller chip centrally disposed on the supporting plane, and a sub-package disposed on the supporting plane. The sub-package may include; sub-package pads disposed on a lower surface of the sub-package, a first stack structure disposed on the supporting plane to one side of the controller chip and including vertically stacked chips, a second stack structure disposed on the supporting plane to another side of the controller chip and adjacent to the first stack structure in a first horizontal direction and including vertically stacked chips, and a first sealant sealing the first stack structure and the second stack structure.

According to one aspect of the inventive concept, there is provided a semiconductor package including; a redistribution wiring layer, a controller chip centrally disposed on the redistribution wiring layer, a first sealant disposed on the redistribution wiring layer, wherein the controller chip is buried in the first sealant, through vias connected to the redistribution wiring layer through the first sealant, and a sub-package disposed on an upper surface of the first sealant. The sub-package may include; a first stack structure disposed to one side of the controller chip on the upper surface of the first sealant and including vertically stacked chips, a second stack structure disposed to another side of the controller chip on the upper surface of the first sealant adjacent to the first stack structure in a first horizontal direction and including vertically stacked chips, and a second sealant sealing the first stack structure and the second stack structure.

According to one aspect of the inventive concept, there is provided a semiconductor package including; a board substrate, a controller chip centrally disposed on the board substrate, through vias laterally disposed in a first horizontal direction in opposing outer portions of the board substrate, a sub-package mounted on the board substrate through the through vias and including chips, and an external sealant sealing the controller chip, the through vias, and the sub-package. The sub-package may include; a first stack structure disposed to one side of the controller chip and including vertically stacked chips, a second stack structure disposed to another side of the controller chip adjacent to the first stack structure in a first horizontal direction and including vertically stacked chips.

BRIEF DESCRIPTION OF THE DRAWINGS

Various advantages, benefits and features of the inventive concept, as well as the making and use of the inventive concept may be more clearly understood upon consideration of the following detailed description together with the accompanying drawings, in which.

DETAILED DESCRIPTION

Throughout the written description and drawings, like reference numbers and labels are used to denote like or similar elements, components, method steps and/or features. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

Figure 1:
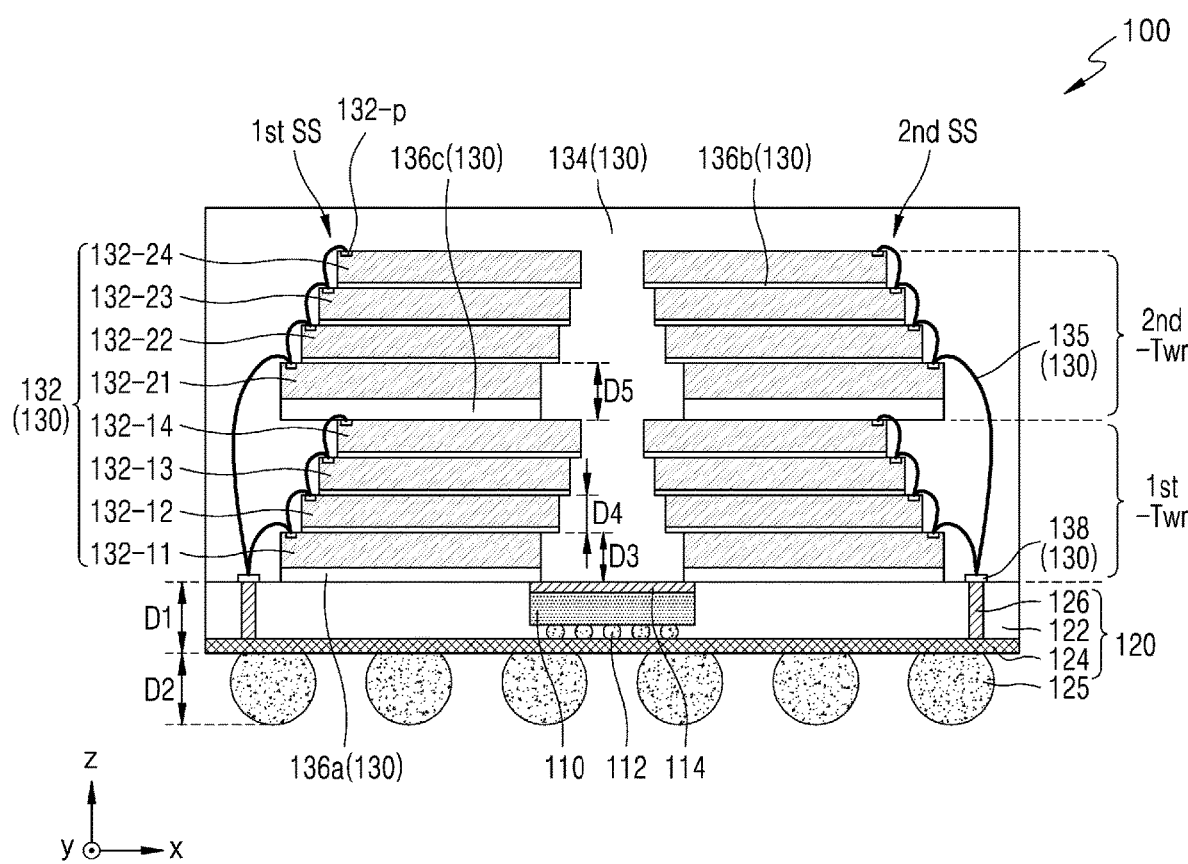
FIG. 1 is a cross-sectional view of a semiconductor package including a sub-package according to embodiments of the inventive concept.

Figure (FIG. 1 is a cross-sectional view illustrating a semiconductor package 100 including a sub-package according to embodiments of the inventive concept.

Referring to FIG. 1, the semiconductor package 100 may generally include a controller chip 110, a supporting plane 120, and a sub-package 130 including chips 132.

The controller chip 110 may be used to perform various signals processing and control the transfer (e.g., sending and/or receiving) of signals (e.g., command signals, control signals, address signals, power signals, data signals, etc.)

between the sub-package 130 and an external device. For example, the controller chip 110 may control the transfer of address signals and data signals between the chips 132 of the sub-package 130 and the external device. The controller chip 110 may also control the transfer of power signals between the chips 132 of the sub-package 130 and the external device.

In this regard, the controller chip 110 may include one or more logic devices providing signal processing capabilities, as well as controlling signal transfer. The logic devices may include, for example, circuits implementing AND, NAND, OR, NOR, XOR, XNOR functions as OR/AND/INVERTER (OAI), AND/OR (AO), and AND/OR/INVERTER (AOI) functions. Alternately or additionally, the logic devices may include circuits implementing an inverter (INV), an adder (ADD), a delay (DLY), a filters (FIL), a multiplexer (MXT/MXIT), a flip-flop (e.g., a D flip-flop, a reset flip-flop, a master-slave flip-flop) a latch, a counter, a register, and/or a buffer. Alternately or additionally, the logic devices may include circuits performing analog signal processing, analog-to-digital (A/D) conversion, and digital control.

In the illustrated example of FIG. 1, the controller chip 110 is substantially encompassed (or buried) in a second sealant 122 of the supporting plane 120. The controller chip 110 may be centrally disposed (e.g., at or near a center portion) on the supporting plane 120, and extend in a first horizontal (or X−) direction. The controller chip 110 may be mounted on (e.g., mechanically assembled and/or electrically connected) a redistribution wiring layer 124 through bumps 112 using (e.g.) a flip-chip bonding technique.

Assuming the use of a flip-chip bonding structure such as the one illustrated in FIG. 1, a lower surface of the controller chip 110 may be an active surface and an upper surface of the controller chip 110 may be an inactive surface. With this type of configuration, thermal energy (or heat) generated by operation of the controller chip 110 may be readily dissipated (or exhausted) away from the sub-package 130 through a combination of the bumps 112, the redistribution wiring layer 124, and external connection members 125.

An adhesive layer 114 may be disposed on the upper surface of the controller chip 110, and the controller chip 110 may be attached to a lower surface of the sub-package 130 through the adhesive layer 114. A first adhesive layer 136a may be disposed between the lower surface of the sub-package 130 and a lower surface of a lowermost (or first) chip 132-11 of a first (chip) tower 1 st-Twr. The supporting plane 120 may further include through vias 126 variously connecting the redistribution wiring layer 124 and sub-package pads 138.

Here, it should be noted that the entirety of the sub-package 130 is substantially encompassed (or encapsulated) in a first sealant 134.

The supporting plane 120 may have a plate-like shape principally extending in the first horizontal direction and a second horizontal (or Y−) direction intersecting the first horizontal direction. The sub-package 130 may be disposed on a upper surface of the supporting plane 120, and the external connection members 125 may be disposed a lower surface of the supporting plane 120. In some embodiments, each of the external connection members 125 may include, for example, a solder ball, wherein the constellation of external connection members 125 may be provided electrically connection elements between the supporting plane 120 and the external circuit.

In some embodiments, the supporting plane 120 may have a first thickness D1 of about 100 μm, and the external connection members 125 may have a second thickness D2 of at least about 100 μm. In some embodiments, the first thickness D1 may be greater than the second thickness D2.

A thickness of the second sealant 122 may form a majority of the first thickness D1. Hence, the second sealant 122 may have a substantially plate-like shape and completely seal the controller chip 110. That is, the second sealant 122 may cover side surfaces of the controller chip 110 and the adhesive layer 114, may fill space between the controller chip 110 and the redistribution wiring layer 124, and may fill spaces between adjacent bumps 112. Therefore, the controller chip 110 may be understood as being "buried" in the second sealant 122.

In some embodiments, the second sealant 122 may include a thermo-curable resin such as epoxy resin, a thermoplastic resin such as polyimide, and/or a resin including a reinforcing agent such as an inorganic filler (e.g., ABF resin, FR-4 resin, and BT resin). Alternately or additionally, the second sealant 122 may include a molding material such as an epoxy mold compound (EMC). In some embodiments, the second sealant 122 may include material(s) having relatively high thermal conductivity, thus facilitating the dissipation of heat from the controller chip 110 through the second sealant 122. In some embodiments, the second sealant 122 may include a high-k material.

As noted above, the second sealant 122 may be disposed on the redistribution wiring layer 124, wherein the redistribution wiring layer 124 may one or more redistribution wiring portions. The through vias 126 may extend from an upper surface of the redistribution wiring layer 124 which is connected to the external connection members 125 may be disposed on the lower surface of the redistribution wiring layer 124. The through vias 126 may be electrically connected to the external connection members 125 through the redistribution wiring portions of the redistribution wiring layer 124.

Further, the through vias 126 may be disposed at laterally peripheral (or outer) portions of the redistribution wiring layer 124 in the first horizontal direction, and variously arranged in the second horizontal direction. For example, the through vias 126 may be arranged in one or more rows extending in the second horizontal direction on one or both of opposing outer portions of the redistribution wiring layer 124 in the first horizontal direction. Alternately or additionally, the through vias 126 may be arranged in one or more rows extending in the first horizontal direction on one or both of opposing outer portions of the redistribution wiring layer 124 in the second horizontal direction.

The through vias 126 may extend (or pass) through the second sealant 122. Hence, an upper surface of each of the through vias 126 may be exposed through the upper surface of the second sealant 122 and may be respectively connected one of the sub-package pads 138 associated with the sub-package 130. In this manner, each of the sub-package pads 138 may be electrically connected to one or more of the external connection members 125 through the through vias 126 and the redistribution wiring layer 124.

In some embodiments, the through vias 126 may include copper (Cu) and have a post-like (e.g., a circular, polygonal or oval pillar).

The sub-package 130 may include a first stack structure 1st SS and a second stack structure 2nd SS encapsulated by the first sealant 134. The first stack structure 1st SS and the second stack structure 2nd SS may be substantially symmetrical with respect to a center portion of the supporting plane 120 and may be arranged in the first horizontal direction and/or the second horizontal direction. Further, the first stack structure 1st SS and the second stack structure 2nd SS may have substantially the same configuration. Accordingly, only the first stack structure 1st SS will be describer hereafter in detail.

The first stack structure 1st SS may have a two-layer tower structure. For example, the first stack structure 1st SS may include the first tower 1st-Twr and a second tower 2nd-Twr. The first tower 1st-Twr may be disposed on the supporting plane 120 and may include four (4) chips 132—e.g., a first chip 132-11, a second chip 132-12, a third chip 132-13, and a fourth chip 132-14 (hereafter collectively, "first to fourth chips 132-11 to 132-14"). However, the number of chips 132 included in the first tower 1 st-Twr may vary by design (e.g., 2, 3, 5, etc.). The first tower 1 st-Twr may be arranged in staircase-type (or stair-stepped) stack structure. For example, the first to fourth chips 132-11 to 132-14 of the first tower 1st-Twr may be vertically stacked in a staircase-type structure extending upwardly and to the right in the first horizontal direction from the upper surface of the supporting plane 120. As a result, at least a leftward portion of an upper surface of each of the first to fourth chips 132-11 to 132-14 of the first tower 1 st-Twr may be exposed in the first horizontal direction.

One or more chip pads 132-$p$ associated with each of the first to fourth chips 132-11 to 132-14 may be disposed on the exposed portion of the respective upper surface. Therefore, the upper surface of each of the first to fourth chips 132-11 to 132-14 may correspond to an active surface, and a lower surface thereof may correspond to an inactive surface.

In some embodiments, the first to fourth chips 132-11 to 132-14 may be mounted on the supporting plane 120 using (e.g.) a wire bonding technique. That is, the chip pads 132-$p$ of each of the first to fourth chips 132-11 to 132-14 may be connected to one of the sub-package pads 138 through a connecting wire 135. However, as shown in FIG. 1, only the chip pads 132-$p$ of the first chip 132-11 may be directly connected to the sub-package pads 138 through a connecting wire 135, whereas chip pads 132-$p$ associated with each of the second to fourth chips 132-12 to 132-14 may be indirectly connected to the sub-package pads 138 through intervening chip pads 132-$p$ of the lower chips 132. However, in other embodiments, the chip pads 132-$p$ of each of the second to fourth chips 132-12 to 132-14 may be directly connected to the sub-package pads 138 through respective connecting wires 135.

The first chip 132-11 may be stacked on and fixed to the supporting plane 120 through the first adhesive layer 136$a$, and each of the second to fourth chips 132-12 to 132-14 may be stacked on and fixed to a corresponding lower chip 132 through a second adhesive layer 136$b$. In some embodiments, the first adhesive layer 136$a$ may be thicker (e.g., about 20 $\mu m$) than the second adhesive layer 136$b$ (e.g., about 5 $\mu m$) in order to securely fix the first stack structure 1st SS.

Therefore, assuming a thickness of each of the chips 132 is about 50 $\mu m$, a third thickness D3 for a combination of the first adhesive layer 136$a$ and the first chip 132-11 may be about 70 $\mu m$, and a fourth thickness D4 for a combination of the second adhesive layer 136$b$ and one of the second to fourth chips 132-12 to 132-14 may be about 55 $\mu m$. However, the foregoing values are merely illustrative, and those skilled in the art will appreciate that thicknesses of chips and adhesive layers may vary by design.

The second tower 2nd-Twr may be disposed on the first tower 1st-Twr and may include a similar configuration of vertically stacked and staircase-type chips 132, intervening adhesive layers and connecting wires 135. Thus, first to fourth chips 132-21 to 132-24 of the second tower 2nd-Twr may be mounted on an upper surface of the first tower 1st-Twr.

Here again, one or more chip pads 132-$p$ respectively associated with each of the first to fourth chips 132-21 to 132-24 may be directly or indirectly connected to the sub-package pads 138 through the connecting wire 135.

The lowermost (or first) chip 132-21 of the second tower 2nd-Twr may be stacked on and fixed to the fourth chip 132-14 of the first tower 1st-Twr through a third adhesive layer 136$c$. Each of the second to fourth chips 132-22 to 132-24 may be stacked on and fixed to a lower chip 132 through a respective second adhesive layer 136$b$. Here, the third adhesive layer 136$c$ (e.g., 50 $\mu m$) may be thicker than the first adhesive layer 136$a$ and thicker than the second adhesive layers 136$b$ in order to reinforce the first chip 132-21 and secure a wire bonding space between the chip pads 132-$p$ of the third chip 132-13 and the chip pads 132-$p$ of the fourth chip 132-14 of the first tower 1st-Twr. Accordingly, a fifth thickness D5 for a combination of the third adhesive layer 136$c$ and the first chip 132-21 may be about 100 $\mu m$.

In some embodiments, the first chip 132-21 may be thicker than the any one of the second to fourth chips 132 132-22 to 132-24. For example, the first chip 132-21 may be about 70 $\mu m$, and the fifth thickness D5 may be about 120 $\mu m$. However, a thickness of each of the chips 132 and the third adhesive layer 136$c$ may vary by design.

Assuming that the second stack structure 2nd SS is symmetrical with respect to the first stack structure 1st SS, the chips 132 of the first towers 1st-Twr of the first stack structure 1st SS and the second stack structure 2nd SS may be disposed more closely to one another as the stacks extend upwardly in a third (or X−) direction substantially orthogonal to the first and second horizontal directions. Also, the chips 132 of the second towers 2nd-Twr of the first stack structure 1st SS and the second stack structure 2nd SS may be disposed more closely to one another toward as the stacks extend upwardly in the third direction.

In some embodiments, the chips 132 of the second stack structure 2nd SS may be connected using a wire bonding structure arranged to the left in the first horizontal direction, and the chips 132 of the first stack structure 1st SS may be connected using a wire bonding structure arranged to the right in the first horizontal direction.

The first sealant 134 may seal the first stack structure 1st SS and the second stack structure 2nd SS on the supporting plane 120. Here, the first sealant 134 may include one or more of the materials previously described n relation to the second sealant 122. However, the first sealant 134 need not be provided in view of heat dissipation issues related to the controller chip 110. Accordingly, the first sealant 134 may include material(s) having lower thermal conductivity than the second sealant 122. That is, within the semiconductor package 100 of FIG. 1, the thermal conductivity of the second sealant 122 may be greater than that of the first sealant 134.

In some embodiments, side surfaces of the first sealant 134 may be substantially coplanar with side surfaces of the supporting plane 120 and/or side surfaces of the supporting plane 120. The first stack structure 1st SS, the second stack structure 2nd SS, and the first sealant 134 may be formed at a wafer level, and then separated (or singulated) prior to the manufacture of the semiconductor package 100. One method of manufacture for the semiconductor package 100 of FIG. 1 will be described in some additional detail hereafter with reference to FIGS. 5A to 5G.

In the semiconductor package 100 of FIG. 1, the chips 132 included in the first stack structure 1st SS and/or the second stack structure 2nd SS may be NAND flash chips. Therefore, in some embodiments, the sub-package 130 may be understood as a NAND sub-package 130.

In some embodiments, the semiconductor package 100 may be a universal flash storage (UFS).

Of note in relation to the semiconductor package 100 of FIG. 1, because the controller chip 110 is buried in the second sealant 122 of the supporting plane 120, a total thickness of the semiconductor package 100 may be markedly reduced. For example, a total thickness of the semiconductor package 100 may be 1.0 mm or less. That is, assuming by way of example that each of the first thickness D1 of the supporting plane 120 and the second thickness D2 of the external connection member 150 is about 100µm, the third thickness D3 of the first adhesive layer 136a and the first chip 132-11 of the first tower 1st-Twr is about 70µm, the fifth thickness D5 of the third adhesive layer 136c and the first chip 132-21 of the second tower 2nd-Twr is about 70µm, the fourth thickness D4 of the second adhesive layer 136b and one of the second to fourth chips 132-12 to 132-14 of the first tower 1st-Twr and the second to fourth chips 132-22 to 132-24 of the second tower 2nd-Twr is about 55 µm, and a thickness of a portion of the first sealant 134 on an upper surface of the fourth chip 132-24 of the second tower 2nd-Twr is about 170µm, a total thickness for the semiconductor package 100 may be about [100(D1)+100(D2)+70(D3)+55(D4)*6+100(D5)+170] or about 870µm).

Further, assuming that a thickness of the first chip 132-21 of the second tower 2nd-Twr is about 70 µm, a total thickness of the semiconductor package 100 may be about 890µm. Still further, even assuming tat a thickness of the external connection members 125 is about 150µm, a total thickness of the semiconductor package 100 may be range from about 920µm to about 940µm, or still less than 1.0mm.

By way of comparison, certain conventional semiconductor packages include a controller chip disposed in a dolmen structure, wherein a thickness of the controller chip is about 70µm. However, an additional thickness of about 110µm is required for a spacer associated with the dolmen structure. Therefore a total thickness for such conventional semiconductor packages may be expected to range from about 1,050 µm to about 1,070µm. Further, assuming a thickness for the external connection members 125 is about 150µm, a total thickness for such conventional semiconductor packages may be expected to range from about 1,100 µm or about 1,120µm.

Of further noted in relation to the semiconductor package 100 of FIG. 1, the controller chip 110 may be mounted on the redistribution wiring layer 124 using a flip-chip bonding structure. Therefore, heat generated by operation of the controller chip 110 may be readily dissipated through a combination of the bumps 114, the redistribution wiring layer 124, the external connection members 125 and the encapsulating second sealant 122 formed from material(s) having high thermal conductivity. And since heat dissipation for the controller chip 110 is improved, the power supplied to (or transferred though) the controller chip 110 may be increased. As a result, the semiconductor package 100 of FIG. 1 may better (e.g., more quickly) respond to changing demands for power associated with the semiconductor package 100.

Of still further note in relation to the semiconductor package 100 of FIG. 1, because the controller chip 110 is centrally disposed on the supporting plane 120, the routing of various wiring connection structures between the controller chip 110 and the external connection members 125 may be optimized. That is, "routability" (e.g., a facility with which various connections may be are laid out) between the controller chip 110 and the external connection members 125 may be optimized.

Figure 2:
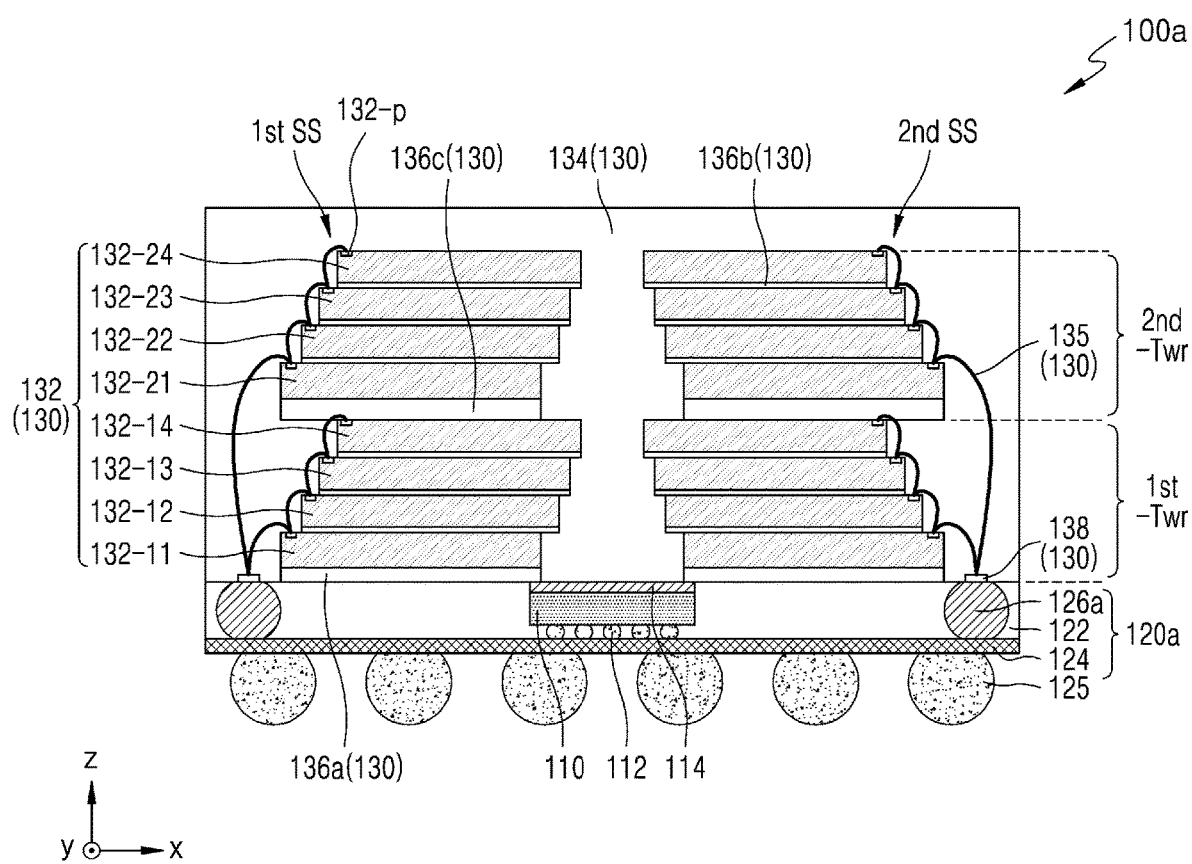
FIGS. 2, 3 and 4 are respective cross-sectional views of semiconductor packages including a sub-packages according to embodiments of the inventive concept.
Figure 3:
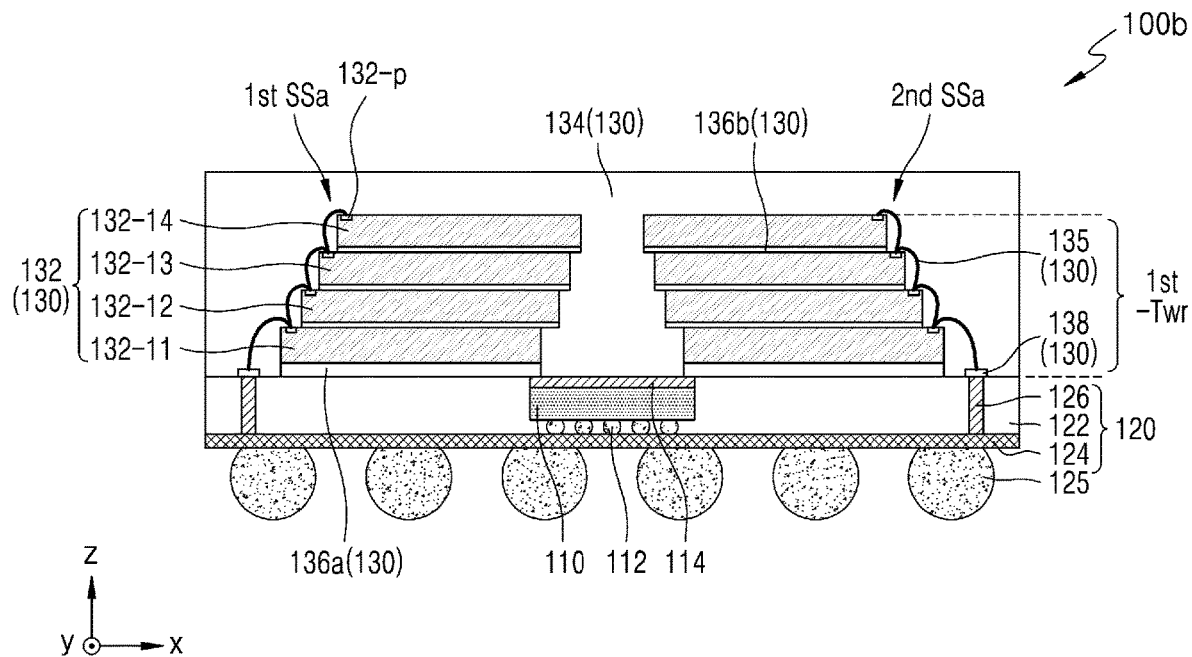
Figure 4:
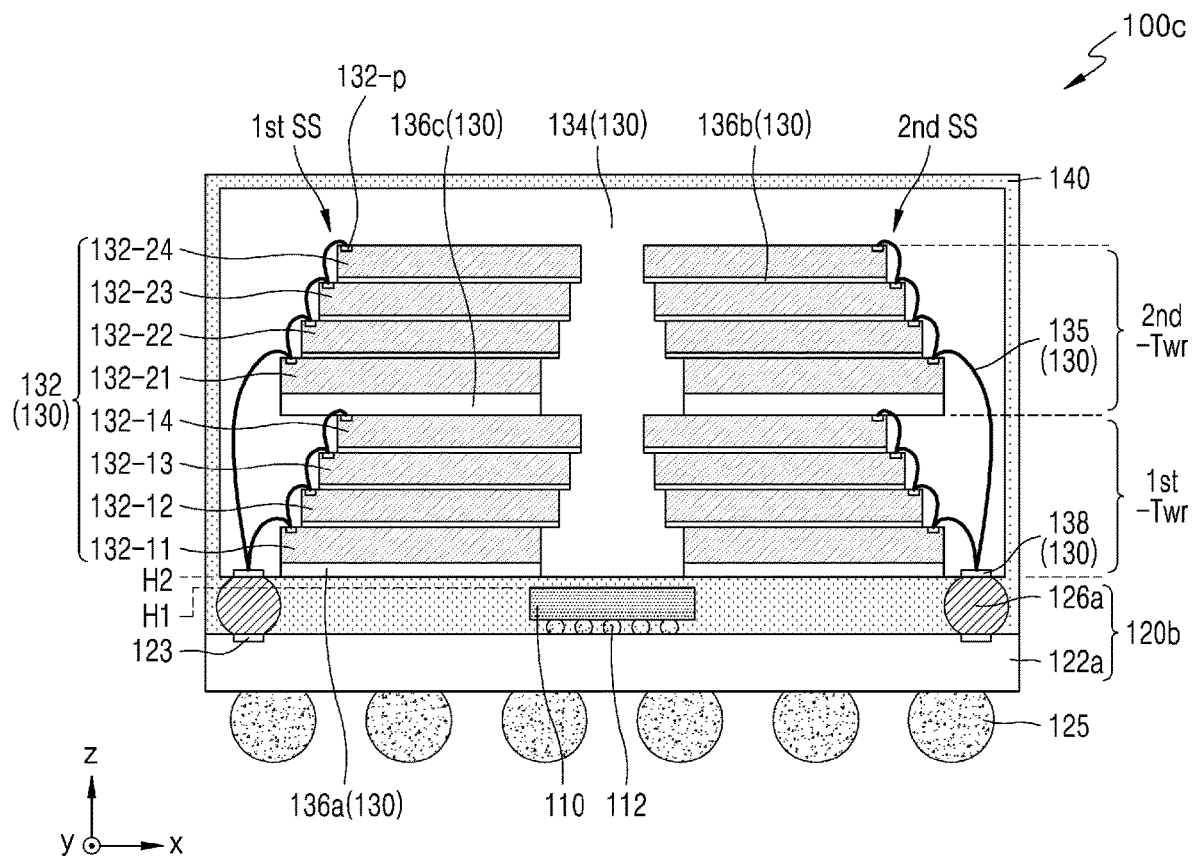

FIGS. 2, 3 and 4 are respective cross-sectional views of semiconductor packages including a sub-package according to embodiments of the inventive concept.

Referring to FIGS. 1 and 2, a semiconductor package 100a differs from the semiconductor package 100 in a structure of through vias 126a extending between a supporting plane 120a and the external connection members 125. For example, in the semiconductor package 100a, the respective through vias 126a may include a solder ball, or a stack of solder balls.

Referring to FIGS. 1 and 3, a semiconductor package 100b differs from the semiconductor package 100 in a structure of a first stack structure 1st SS and a second stack structure 2nd SS. That is, in the semiconductor package 100b, the first stack structure 1st SS and the second stack structure 2nd SS may only a single tower structure (e.g., the first tower 1st-Twr). Accordingly, in the semiconductor package 100b, because each of the first stack structure 1st SS and the second stack structure 2nd SS may includes only the first tower 1st-Twr, a total thickness of the semiconductor package 100b may be markedly reduced.

Referring to FIGS. 1 and 4, a semiconductor package 100c may differ from the semiconductor package 100 in that the semiconductor package 100c further includes a structure of a supporting plane 120b and an external sealant 140. That is, the semiconductor package 100c may include the controller chip 110, a supporting plane 120b, the sub-package 130, and an external sealant 140. The controller chip 110 and the sub-package 130 may be substantially the same as the controller chip 110 and the sub-package 130 of FIG. 1. However, the controller chip 110 may be mounted using through bumps 112, a board substrate 122a instead of a redistribution wiring layer 124, wherein the adhesive layer may be omitted from the upper surface of the controller chip 110. Here, within the semiconductor package 100c, the controller chip 110 may be centrally disposed on the board substrate 122a in a first horizontal direction, thereby improving routability between the controller chip 110 and an external connection members 125.

The supporting plane 120b may include the board substrate 122a and through vias 126a. The board substrate 122a may include a ceramic substrate, a printed circuit board (PCB), a glass substrate, and/or an interposer substrate. In some embodiment, the board substrate 122a may be a PCB including wiring layer(s) disposed on surface(s) and/or the body of the PCB. Such wirings may one or more layers. For example, where wiring is disposed within the PCB, the PCB may include at least one more material layer than a number of interposed wiring layers. Alternately or additionally, wiring may be disposed on upper and/or lower surface(s) of the PCB as a single wiring layer(s).

In some embodiments, a passivation layer may be disposed on the upper and/or lower surface(s) of the PCB body to cover and protect wiring(s) disposed on the upper and/or lower surface(s) of the PCB body. In some embodiments, the passivation layer may include, for example, a solder resist (SR).

In some embodiments, one or more substrate pads 123 may be disposed on the upper and/or lower surface(s) of the PCB, wherein the through vias 126a may extend through the PCB to variously connect the substrate pads 123 with the external connection members 125. Further in this regard, a "body layer" regardless of composition may account for a majority of the board substrate 122a and may be substantially the same as the board substrate 122a in external appearance and/or performance.

The through vias 126a may include, for example, solder ball(s) (e.g., stacked solder balls). With this configuration, the through vias 126a may support the sub-package 130, in addition to variously connecting the substrate pad 123, the sub-package pads 138, and/or the external connection members 125.

The external sealant 140 may be used to seal the sub-package 130, the controller chip 110, and the through vias 126a on the board substrate 122a. That is, the external sealant 140 may cover the upper surface and side surfaces of the sub-package 130 and fill a space between the sub-package 130 and the board substrate 122a. The external sealant 140 may also seal the controller chip 110 and the through vias 126a disposed between the sub-package 130 and the board substrate 122a, and may fill spaces between the bumps 112.

The upper surface of the controller chip 110 may be disposed at a first height (or level) which is lower than a second height H2 of the lower surface of the sub-package 130. Therefore, the external sealant 140 may be filled between the controller chip 110 and the sub-package 130. Alternately, the upper surface of the controller chip 110 may contact the lower surface of the sub-package 130, and the first height H1 may be substantially the same as the second height H2.

The external sealant 140 may includes one or more material(s) previously described in relation to the second sealant 122. Accordingly, the external sealant 140 may include a thermo-curable resin such as epoxy resin, a thermoplastic resin such as polyimide, and/or a resin including a reinforcing agent such as an inorganic filler (e.g., ABF resin, FR-4 resin, and BT resin). The external sealant 140 may include a material having high thermal conductivity, such as a high-k material in order to maximize the dissipation of heat from the controller chip 110 through the external sealant 140.

A total thickness of the semiconductor package 100c may be 1.0 mm or less. That is, for example, assuming that the sub-package 130 is substantially the same as the sub-package 130 of FIG. 1, a thickness of each of the board substrate 122a and the through vias 126a may be about 100 $\mu m$, and a thickness of a portion of the external sealant 140 on the upper surface of the sub-package 130 may be about 30 $\mu m$. Accordingly, a total thickness of the semiconductor package 100c may be about [100(board substrate)+100 (external connection member)+100(through via)+30(upper portion of external sealant)+670(sub-package)] or about 1,000 $\mu m$ ). Assuming that the upper surface of the controller chip 110 contacts a lower surface of the sub-package 130, a thickness of the through vias 126a may decrease by about 70 $\mu m$ or less, and a total thickness of the semiconductor package 100c may be reduced to about 970 $\mu m$ all or less.

FIGS. 5A to 5G are related cross-sectional views illustrating in one example a method of manufacture for the semiconductor package of FIG. 1.

Figure 5A:
FIGS. 5A, 5B, 5C, 5D, 5E, 5F and 5G (hereafter collectively, "FIGS. 5A to 5G") are related cross-sectional views illustrating in one example a method of manufacture for the semiconductor package of FIG. 1.
Figure 5A:
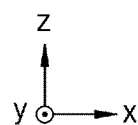

Referring to FIG. 5A, a sub-package pads 138 may be formed on a first carrier substrate 200. The sub-package pads 138 may include a metal, such as for example, Cu or aluminum (Al). The sub-package pads 138 may be formed using a pulse plating process or a direct current (DC) plating process. The first carrier substrate 200 may include a silicon wafer and may have a size that is greater than that of the silicon wafer. As described below, structures corresponding to the sub-package 130 on the first carrier substrate 200 may be formed at a wafer level. That is, a structure corresponding to the sub-package 130 on the first carrier substrate 200 may be provided, and subsequently, other elements may be formed to complete corresponding semiconductor packages. Then, the semiconductor packages may be singulated.

Figure 5B:
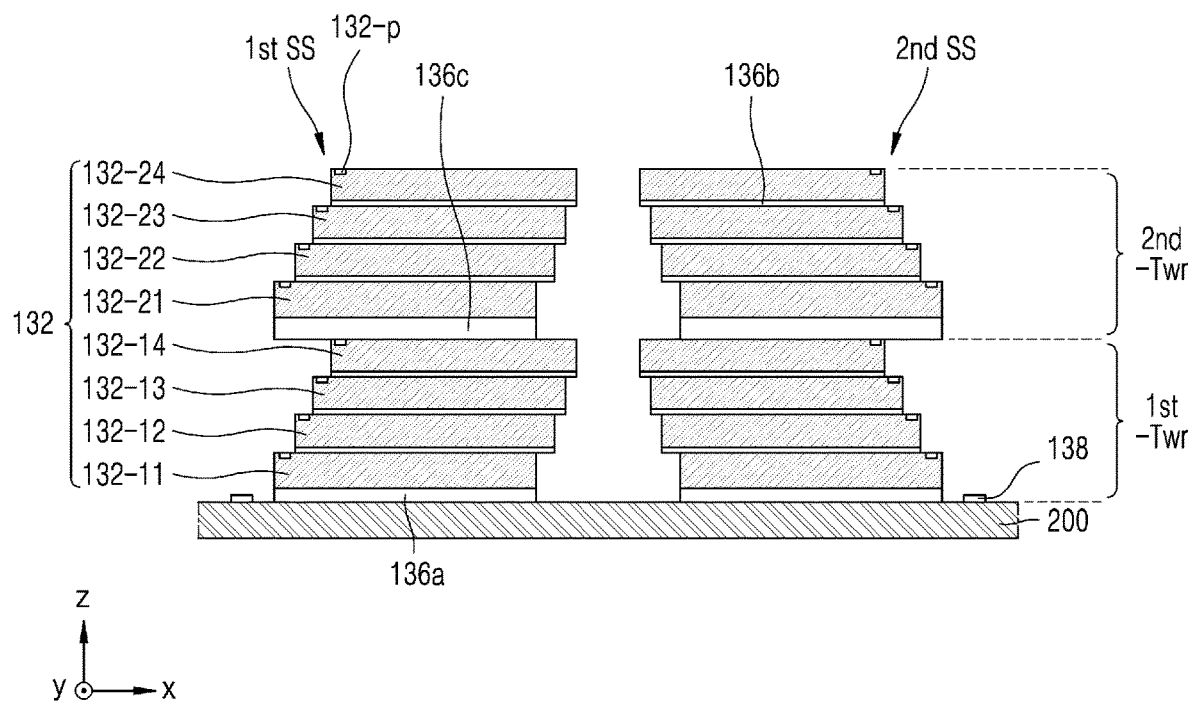

Referring to FIG. 5B, after the sub-package pads 138 is formed, a first stack structure 1st SS and a second stack structure 2nd SS may be formed on the first carrier substrate 200. Each of the first stack structure 1st SS and the second stack structure 2nd SS may include a two-layer tower structure including a first tower 1 st-Twr and a second tower 2nd-Twr. However, in some embodiments, each of the first stack structure 1st SS and the second stack structure 2nd SS may have a single tower structure, such as only the first tower 1st-Twr. As described above, the first stack structure 1st SS and the second stack structure 2nd SS may be provided on the first carrier substrate 200.

Each of the first tower 1st-Twr and the second tower 2nd-Twr may include a reasonable number of chips (e.g., 4) 132. The chips 132 may be, for example, NAND flash chips. Each of the chips 132 may be stacked on and fixed to the first carrier substrate 220 or a corresponding lower chip 132 through intervening adhesive layers (e.g., first to third adhesive layers 136a and 136c). Here, each of the first tower 1st-Twr and the second tower 2nd-Twr, the thickness of each of the chips 132 and the respective adhesive layers may be substantially the same as those previously described in relation to the semiconductor package 100 of FIG. 1.

Figure 5C:
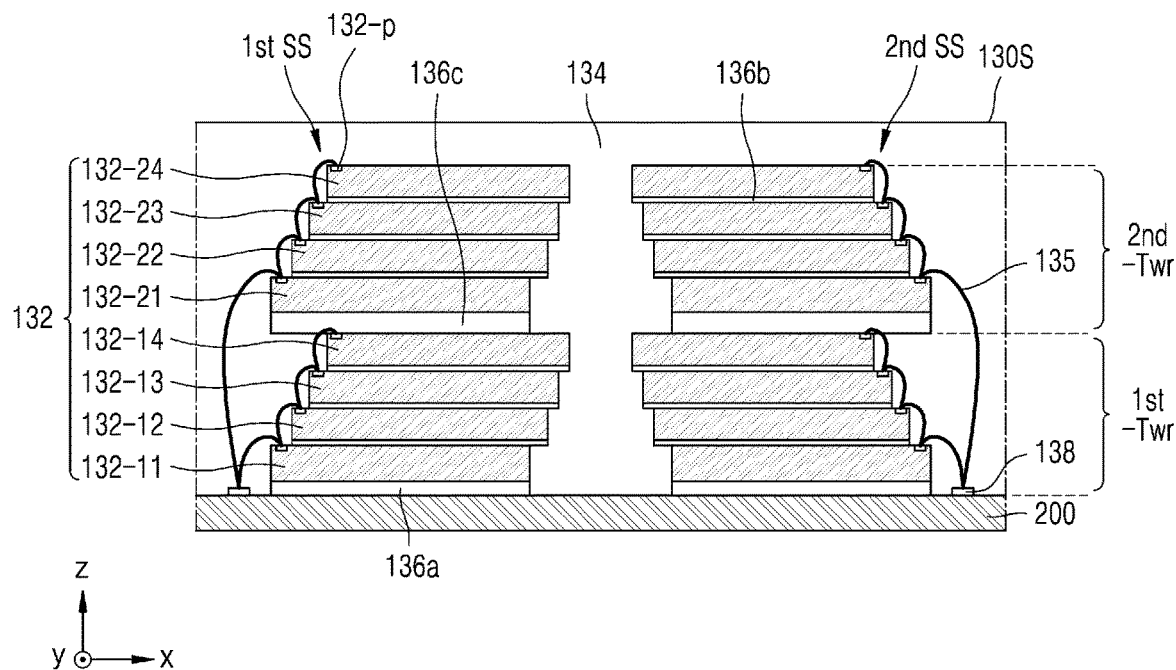

Referring to FIG. 5C, subsequently, the chips 132 of each of the first tower 1st-Twr and the second tower 2nd-Twr may be wire-bonded. Accordingly, chip pads 132-p for each of the chips 132 may be electrically connected to the sub-package pads 138 through one or more connecting wires 135. In some embodiments, only a chip pads 132-p of a first chip 132-11 of the first tower 1 st-Twr and a chip pads 132-p of a first chip 132-21 of the second tower 2nd-Twr may be directly connected to the sub-package pads 138 through a connecting wire 135, whereas chip pads 132-p of the other stacked chips 132 may be respectively connected to the sub-package pads 138 via chip pads 132-p of lower chips 132. Alternately, the chip pads 132-p of the other chips 132 may be directly connected to the sub-package pads 138 through respective connecting wires 135.

After wire bonding has been completed, the first stack structure 1st SS and the second stack structure 2nd SS may be sealed using the first sealant 134 to form a sub-package structure 130S. The first sealant 134 may completely seal respective pairs of the first stack structure 1st SS, and the second stack structure 2nd SS on the first carrier substrate 200. That is, the first sealant 134 may seal the first stack structure 1st SS and the second stack structure 2nd SS at a wafer level. Therefore, the sub-package structure 130S may include a plurality of sub-packages 130. Here, the first sealant 134 may include one or more of the materials previously described in relation to the semiconductor package 100 of FIG. 1.

Figure 5D:
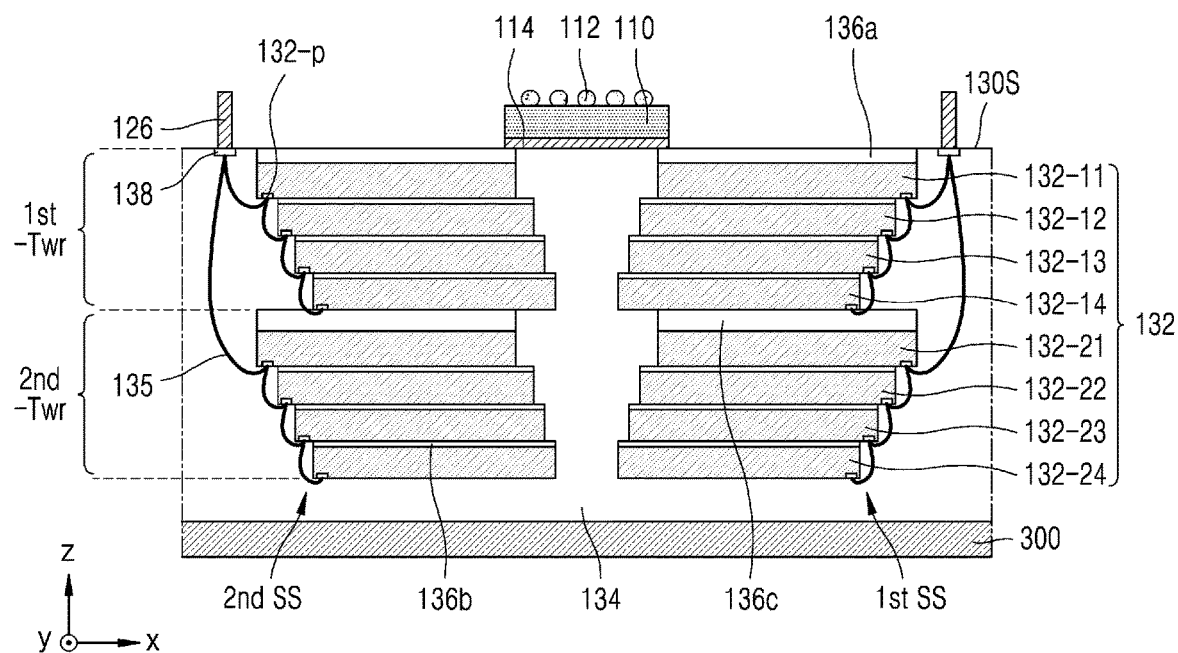

Referring to FIG. 5D, after the sub-package structure 130S has been formed, the first carrier substrate 200 may be detached from the sub-package structure 130S, and the sub-package structure 130S may be flipped over and disposed on a second carrier substrate 300. The second carrier substrate 300 may be substantially the same size as the first carrier substrate 200, and during subsequent processing, the second carrier substrate 300 may support the sub-package structure 130S as well as additional elements.

Subsequently, the controller chip 110 may be disposed on an upper surface of the sub-package structure 130S. The controller chip 110 may be adhered and fixed to the upper surface of the sub-package structure 130S by using an adhesive layer 114. For reference, in a current process, the upper surfaces of the sub-package structure 130S and the controller chip 110 may correspond to the lower surfaces of the sub-package structure 130S and the controller chip 110 in the semiconductor package 100 of FIG. 1. After the controller chip 110 is adhered to the sub-package structure 130S, bumps 112 may be formed on the upper surface of the controller chip 110. In some embodiments, the bumps 112 may be previously formed on the controller chip 110, and the controller chip 110 including the bump 112 may be attached on the upper surface of the sub-package structure 130S.

Also, the controller chip 110 may be disposed in each of sub-packages 130 included in the sub-package structure 130S. Also, the controller chip 110 may be centrally disposed in relation to the corresponding sub-package 130 in a the first horizontal direction. Because the controller chip 110 is centrally disposed in relation to the corresponding sub-package 130, routability between the controller chip 110 and external connection members 125 may be optimized.

Furthermore, the upper surface of the sub-package structure 130S may be a surface detached from the first carrier substrate 200, and thus, the upper surface of the sub-package structure 130S may be substantially coplanar with the upper surface of the sub-package pads 138. Also, the upper surface of the sub-package structure 130S may be coplanar with a lower surface of the adhesive layer 114 of the controller chip 110. Here, the upper surface may correspond to the lower surface in the semiconductor package 100 of FIG. 1, and the lower surface may correspond to the upper surface in the semiconductor package 100 of FIG. 1.

After the controller chip 110 is disposed, through vias 126 may be formed on the sub-package pads 138. Here, for example, each of the through vias 126 may be a Cu post, and may be formed using a plating process, for example. In some embodiments, each of the through vias may include one or more solder balls. In a case wherein the respective through vias are formed of a solder ball, a final structure such as the semiconductor package 100a of FIG. 2 may be realized.

Figure 5E:
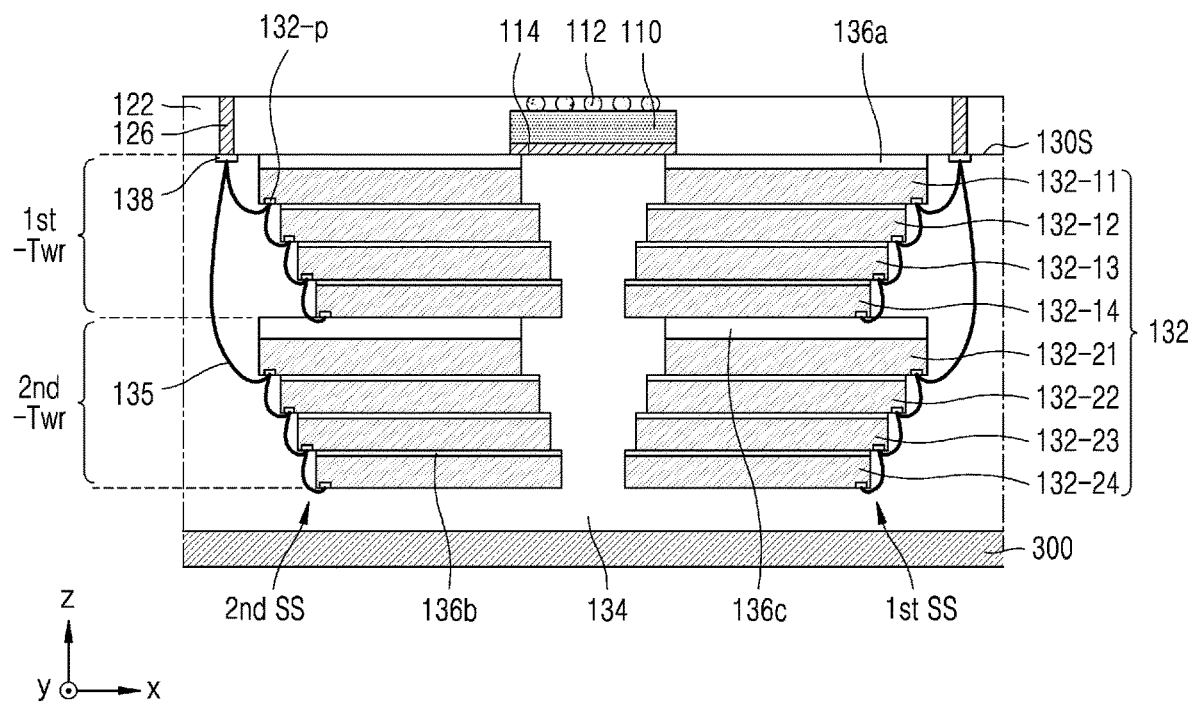

Referring to FIG. 5E, after the through vias 126 is formed, the second sealant 122 sealing the controller chip 110 may be formed. The second sealant 122 may cover side surfaces of the controller chip 110 and the adhesive layer 114 and the upper surface of the controller chip 110. Also, the second sealant 122 may cover side surfaces of the through vias 126 and may fill a space between the bumps 112 of the controller chip 110. Upper surfaces of the through vias 126 and the bumps 112 may be exposed from the second sealant 122. In order to expose the upper surfaces of the through vias 126 and the bumps 112, a grinding process may be performed on the second sealant 122.

Figure 5F:
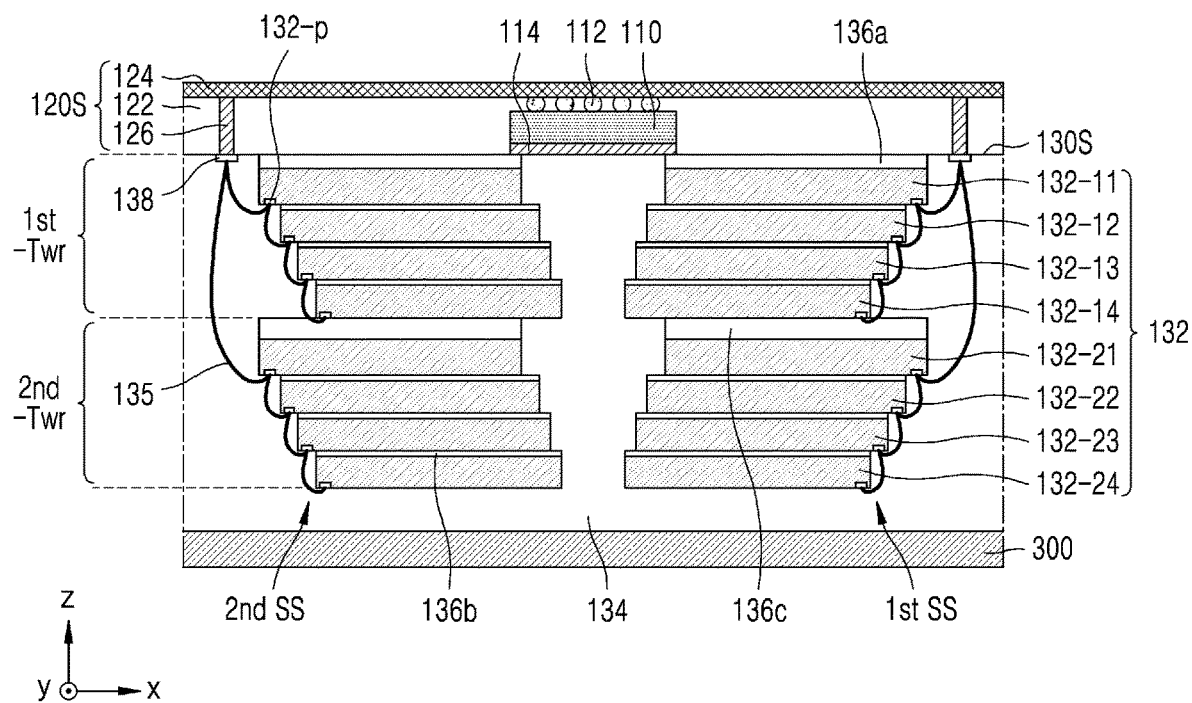

Referring to FIG. 5F, a redistribution wiring layer 124 may be formed on the second sealant 122. Wirings of the redistribution wiring layer 124 may be electrically connected to the through vias 126 and the bumps 112. A supporting plane structure 120S may be finished by forming the redistribution wiring layer 124. The supporting plane structure 120S may include a plurality of supporting planes 120.

Figure 5G:
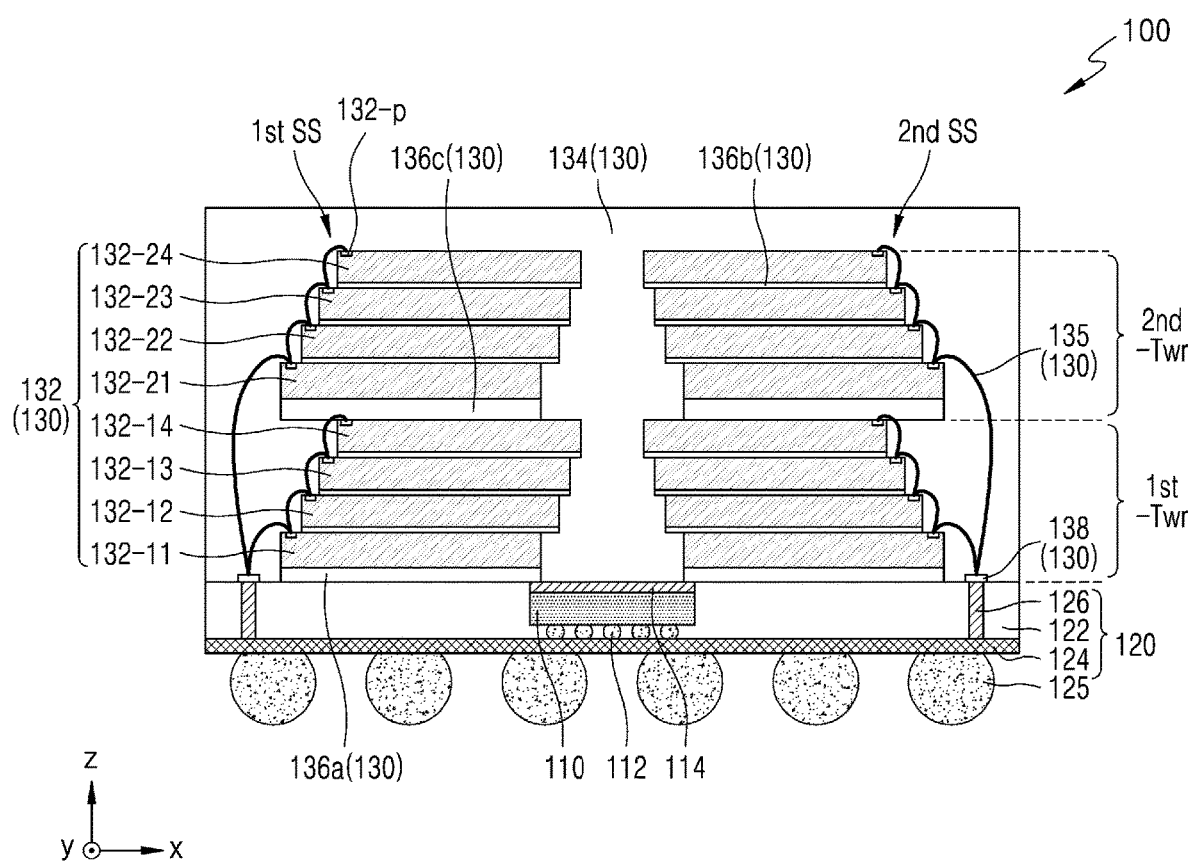

Referring to FIG. 5G, after the supporting plane structure 120S is completed, the external connection members 125 may be formed on the redistribution wiring layer 124. The external connection members 125 may include, for example, a solder ball. Subsequently, the semiconductor package 100 may be completed by singulating the sub-package substructure 130S and the supporting plane structure 120S. In some embodiments, the external connection members 125 may be formed on the semiconductor package 100 after singulation. FIG. 5G illustrates the semiconductor package 100 of FIG. 1 including one sub-package 130. Also, FIG. 5G may correspond to a structure where the sub-package substructure 130S and the supporting plane structure 120S are individualized and flipped over.

FIGS. 6A to 6F are related cross-sectional views illustrating in one example a method of manufacture for the semiconductor package of FIG. 4.

Figure 6A:
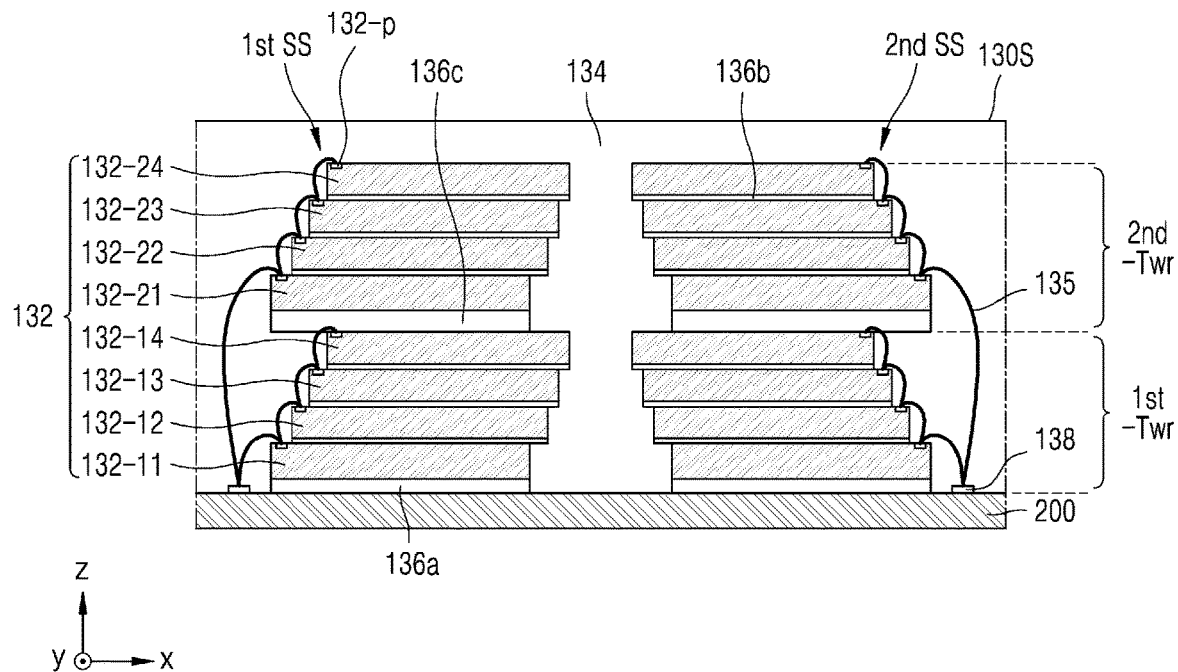
FIGS. 6A, 6B, 6C, 6D, 6E and 6F (hereafter collectively, "FIGS. 6A to 6F") are related cross-sectional views illustrating in one example a method of manufacture for the semiconductor package of FIG. 4.

Referring to FIG. 6A, the sub-package structure 130S may be formed through the processes of FIGS. 5A to 5C. The sub-package structure 130S may include a plurality of sub-packages 130.

Figure 6B:
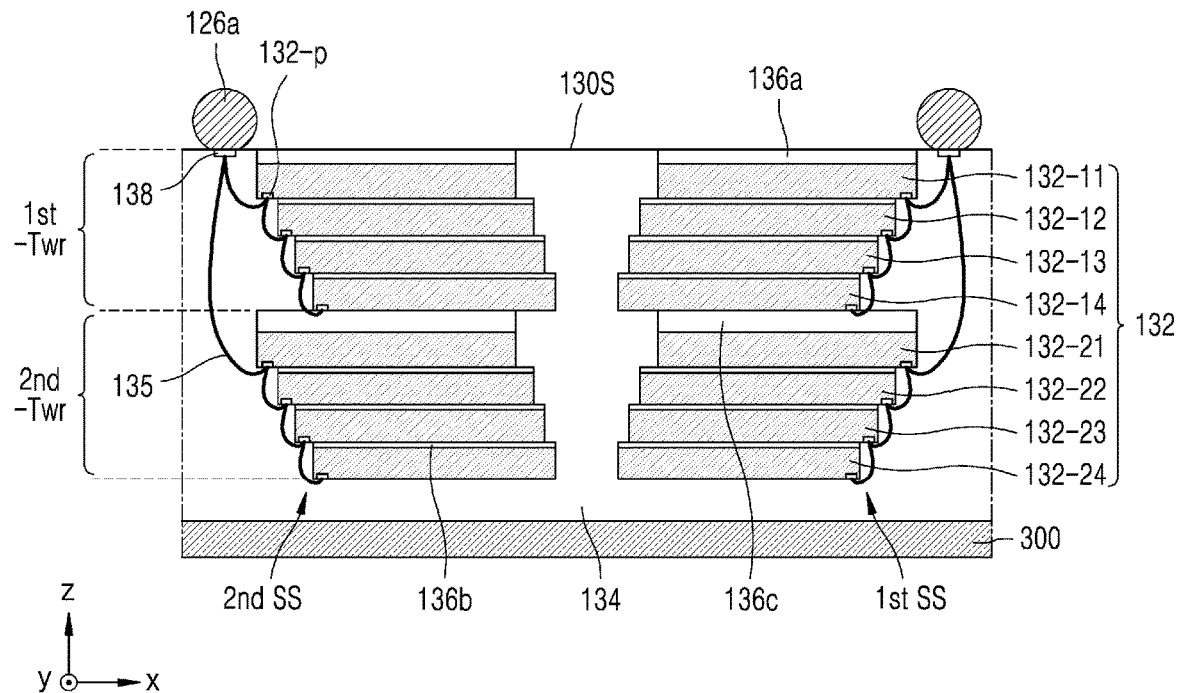

Referring to FIG. 6B, after the sub-package structure 130S is formed, the first carrier substrate 200 may be detached from the sub-package structure 130S, and the sub-package structure 130S may be turned over and may be disposed on the second carrier substrate 300. Subsequently, a through vias 126a may be formed on the sub-package pads 138 on the upper surface of the sub-package structure 130S. The through vias 126a may include a solder ball. In some embodiments, the through vias 126a may have a structure where solder balls are stacked.

In relation to each board substrate 122a in an initial substrate (see 122S of FIG. 6B), the through vias 126a may be disposed on opposing sides of the board substrate 122a in the first horizontal direction. Alternately or additionally, a plurality of through vias 126a may be arranged one or more row(s) extending in the second horizontal direction. In some embodiments, in relation to each board substrate 122a in the initial substrate 122S, the through vias 126a may be disposed on opposing sides of the board substrate 122a in the first horizontal direction and/or the second horizontal direction.

After the through vias 126a are formed, the sub-package structure 130S may be individualized into each sub-package 130 through singulation. Furthermore, in some embodiments, after singulation is performed on the sub-package structure 130S, the through vias 126a may be formed in each of the sub-packages 130. Also, in some embodiments, the through vias 126a may be formed on the initial substrate 122S or the board substrate 122a and may not be formed in the sub-package structure 130S or the sub-packages 130 corresponding to a current process.

Figure 6C:
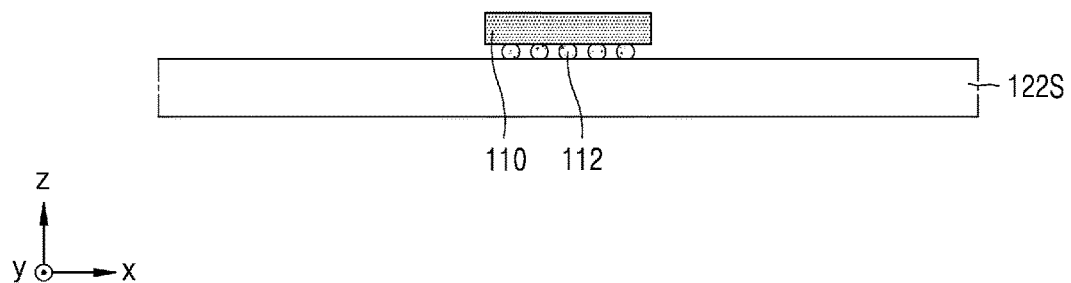

Referring to FIG. 6C, the controller chip 110 may be disposed on the initial substrate 122S. The controller chip 110 may be mounted on the initial substrate 122S in a flip-chip bonding structure by using the bump 112. The initial substrate 122S may be a substrate having a before-singulation state and may include a plurality of board substrates 122a.

The controller chip 110 may be disposed in each of the board substrates 122a included in the initial substrate 122S. Also, the controller chip 110 may be disposed at a center portion of a corresponding board substrates 122a. in the first horizontal direction. Because the controller chip 110 is centrally disposed with respect to the corresponding board substrate 122a, routability between the controller chip 110 and the external connection members 125 may be optimized.

Figure 6D:
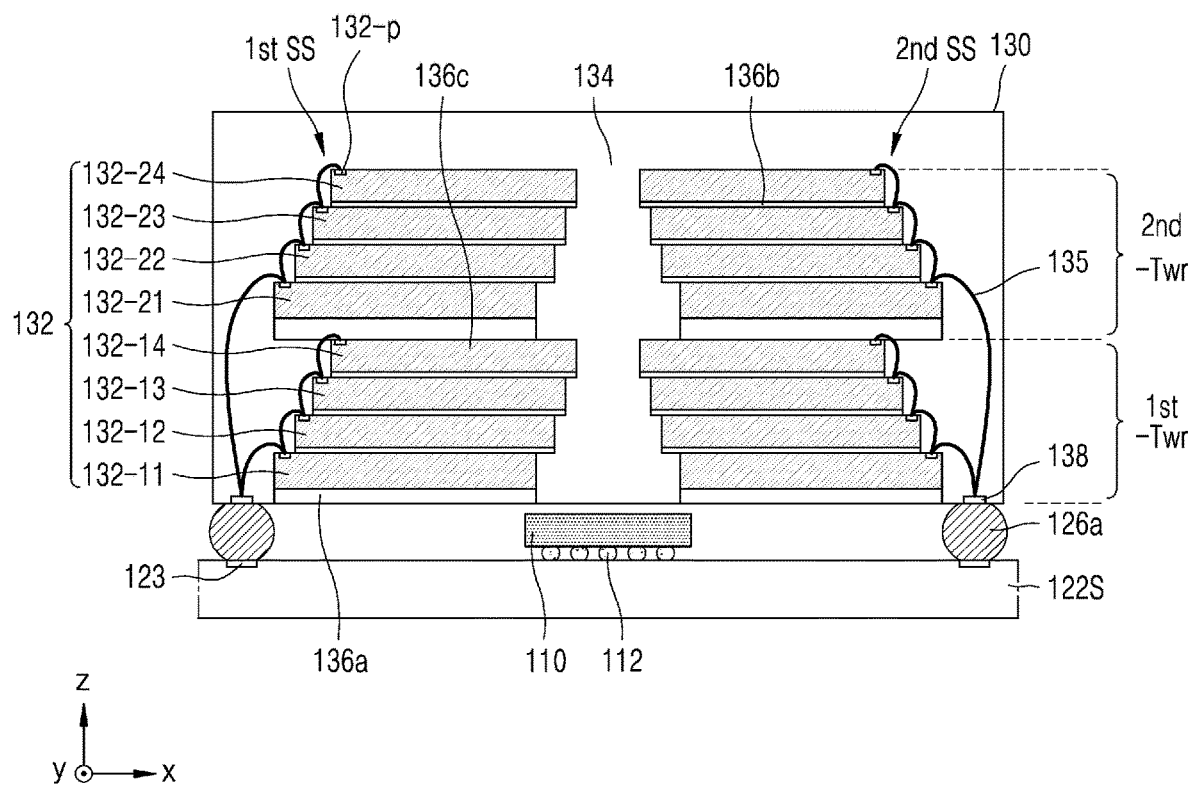

Referring to FIG. 6D, the sub-package 130 may be stacked on the initial substrate 122S using the through vias 126a. A sub-package pads 138 of the sub-package 130 may be variously and electrically connected to a substrate pad 123 of the board substrate 122a through the through vias 126*a*. The sub-package 130 may be stacked on each of the board substrates 122*a* included in the initial substrate 122S. A width of the sub-package 130 in the first horizontal direction and a width of the sub-package 130 in the second horizontal direction may be less than a width of a corresponding board substrate 122*a* in the first horizontal direction and a width of the corresponding board substrate 122*a* in the second horizontal direction, respectively. In view of a height (or a thickness) of the through vias 126*a*, the upper surface of the controller chip 110 may contact the lower surface of the sub-package 130, or may be spaced apart from the lower surface of the sub-package 130.

Figure 6E:
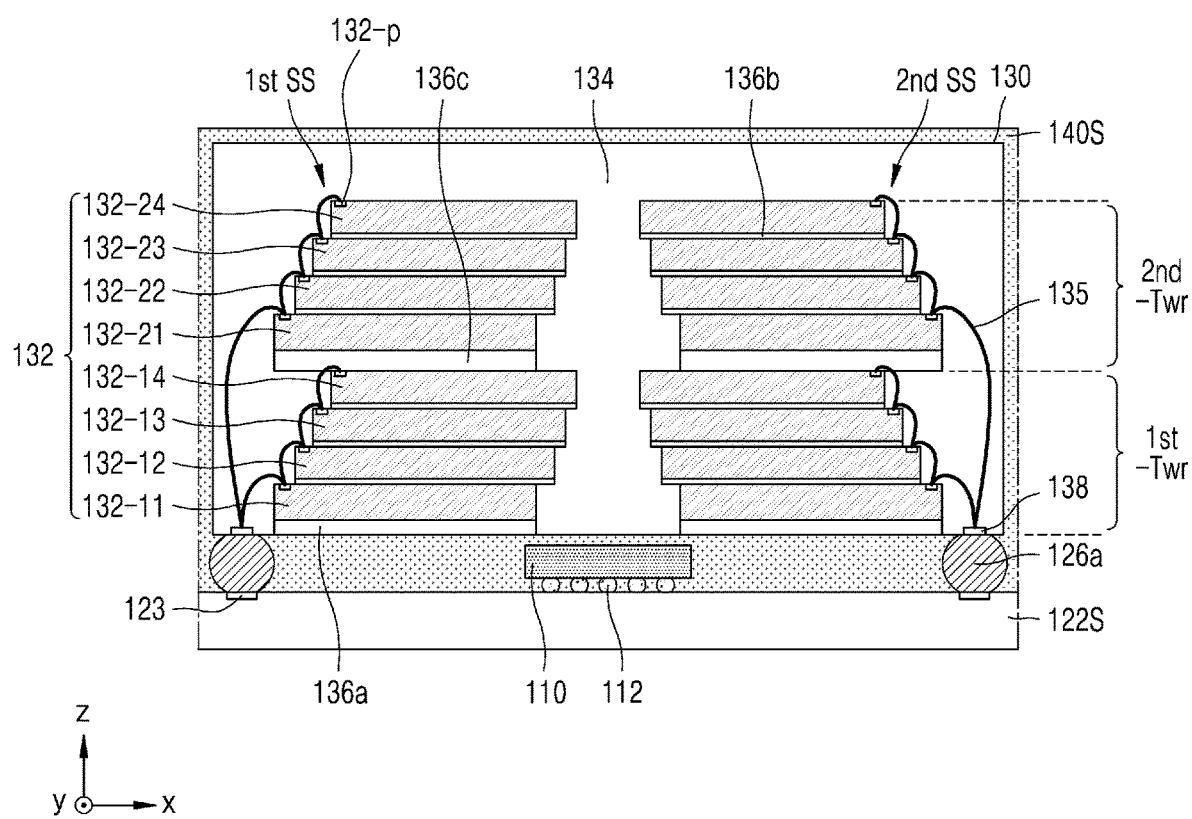

Referring to FIG. 6E, after the sub-package 130 is stacked, an external sealant structure 140 sealing the sub-package 130 on the initial substrate 122S may be formed. The external sealant structure 140S may seal all of a plurality of sub-packages 130 on the initial substrate 122S. That is, the external sealant structure 140S may seal the sub-package 130 at a wafer level. Therefore, the external sealant structure 140S may include a plurality of external sealants 140, and each of the external sealants 140 may seal a corresponding sub-package 130. Descriptions of a structure and material(s) of the external sealant 140 may be substantially the same as those described in relation to the external sealant 140 of the semiconductor package 100*c* of FIG. 4.

Figure 6F:
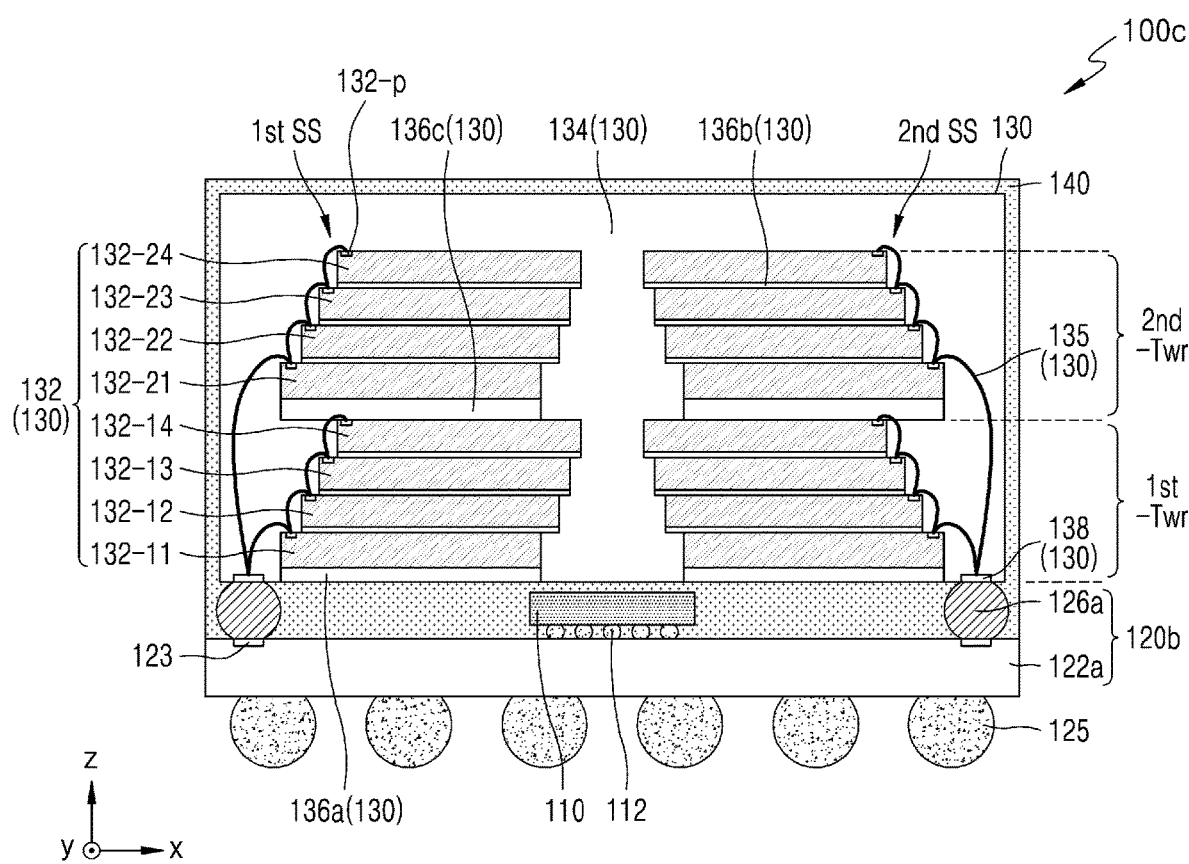

Referring to FIG. 6F, after the external sealant structure 140S is completed, an external connection members 125 may be formed on the initial substrate 122S. The external connection members 125 may include, for example, a solder ball. Subsequently, the semiconductor package 100*c* may be completed by individualizing the external sealant structure 140S and the initial substrate 122S through singulation. In some embodiments, the external connection members 125 may be formed on the semiconductor package 100*c* after singulation. FIG. 6F illustrates the semiconductor package 100*c* of FIG. 4 including one external sealant 140 and sub-package 130.

While the inventive concept has been particularly shown and described with reference to certain illustrated embodiments, those skilled in the art will understood that various changes in form and detail may be made to same without departing from the spirit and scope of the inventive concept as defined by the following claims.

What is claimed is:

1. A semiconductor package comprising:
   a supporting plane;
   a controller chip centrally disposed on the supporting plane; and
   a sub-package disposed on the supporting plane, wherein the sub-package comprises:
      sub-package pads disposed on a lower surface of the sub-package;
      a first stack structure disposed on the supporting plane to one side of the controller chip and including vertically stacked chips;
      a second stack structure disposed on the supporting plane to another side of the controller chip and adjacent to the first stack structure in a first horizontal direction and including vertically stacked chips; and
      a first sealant sealing the first stack structure and the second stack structure, a portion of the first sealant being between the first stack structure and the second stack structure along the first horizontal direction, and the portion of the first sealant being above the controller chip in a vertical direction that is perpendicular to the first horizontal direction.

2. The semiconductor package of claim 1, wherein the supporting plane comprises:
   a redistribution wiring layer;
   a second sealant disposed on the redistribution wiring layer; and
   through vias extending through the second sealant to connect the redistribution wiring layer and the sub-package pads,
   wherein chips of the first stack structure and chips of the second stack structure are connected to at least one of the sub-package pads through respective connecting wires, and
   the controller chip is buried in the second sealant.

3. The semiconductor package of claim 2, wherein the controller chip is mounted on the redistribution wiring layer in a flip-chip bonding structure through bumps, and
   an upper surface of the controller chip is attached on the lower surface of the sub-package through an adhesive layer.

4. The semiconductor package of claim 3, wherein an upper surface of the adhesive layer are substantially coplanar with an upper surface of the second sealant.

5. The semiconductor package of claim 1, wherein the supporting plane includes a board substrate including through vias and a wiring,
   the sub-package is mounted on the supporting plane by the through vias, and
   the through vias connect the wiring to the sub-package pads.

6. The semiconductor package of claim 5, wherein chips of the first stack structure and chips of the second stack structure are connected to the sub-package pad through connecting wires, and
   the controller chip is centrally mounted on the board substrate between the first stack structure and the second stack structure using bumps.

7. The semiconductor package of claim 6, further comprising:
   an external sealant sealing the controller chip, the sub-package, and the through vias.

8. The semiconductor package of claim 1, wherein the first stack structure and the second stack structure are symmetrical with respect to a center of the supporting plane in the first horizontal direction, and
   chips of the first stack structure are vertically stacked in a staircase and chips of the second stack structure are vertically stacked in a staircase, such that chips of the first stack structure and chips of the second stack structure are more closely disposed in the first horizontal direction as the first stack structure and the second stack structure extend vertically upward.

9. The semiconductor package of claim 8, wherein chips of the first stack structure and chips of the second stack structure are connected to the sub-package pads through respective connecting wires.

10. The semiconductor package of claim 1, wherein the first stack structure and the second stack structure are symmetrical with respect to a center of the supporting plane in the first horizontal direction,
   each of the first stack structure and the second stack structure is one of a one-layer tower structure and a two-layer tower structure,
   the one-layer tower structure has a staircase-type stack structure, and the two-layer tower structure includes a first tower and a second tower, wherein the first tower is a one-layer tower, and the second tower is a one-layer tower disposed on the first tower.

11. The semiconductor package of claim 1, wherein chips of the first stack structure and chips of the second stack structure are NAND flash chips, and the semiconductor package is a universal flash storage.

12. A semiconductor package comprising:

a redistribution wiring layer;

a controller chip centrally disposed on the redistribution wiring layer;

a first sealant disposed on the redistribution wiring layer, wherein the controller chip is buried in the first sealant;

through vias connected to the redistribution wiring layer through the first sealant; and a sub-package disposed on an upper surface of the first sealant, wherein the sub-package includes a first stack structure disposed to one side of the controller chip on the upper surface of the first sealant and including vertically stacked chips, a second stack structure disposed to another side of the controller chip on the upper surface of the first sealant adjacent to the first stack structure in a first horizontal direction and including vertically stacked chips, and a second sealant sealing the first stack structure and the second stack structure, a portion of the second sealant being between the first stack structure and the second stack structure along the first horizontal direction, and the portion of the first sealant being above the controller chip in a vertical direction that is perpendicular to the first horizontal direction.

13. The semiconductor package of claim 12, wherein the sub-package further includes sub-package pads disposed on a lower surface of the sub-package and connected to the through vias, and chips of the first stack structure and chips of the second stack structure are connected to the sub-package pads through respective connecting wires.

14. The semiconductor package of claim 13, wherein the controller chip is mounted on the redistribution wiring layer in a flip-chip bonding structure using bumps, and an upper surface of the controller chip is attached on the lower surface of the sub-package through an adhesive layer.

15. The semiconductor package of claim 12, wherein the first stack structure and the second stack structure are symmetrical with respect to the controller chip, and chips of the first stack structure are vertically stacked in a staircase and chips of the second stack structure are vertically stacked in a staircase, such that chips of the first stack structure and chips of the second stack structure are more closely disposed in the first horizontal direction as the first stack structure and the second stack structure extend vertically upward.

16. The semiconductor package of claim 12, wherein the first stack structure and the second stack structure are symmetrical with respect to the controller chip, each of the first stack structure and the second stack structure is one of a one-layer tower structure and a two-layer tower structure, the one-layer tower structure has a staircase-type structure, and the two-layer tower structure includes a first tower and a second tower, wherein the first tower is a one-layer tower, and the second tower is a one-layer tower disposed on the first tower.

17. A semiconductor package comprising:

a board substrate;

a controller chip centrally disposed on the board substrate;

through vias laterally disposed in a first horizontal direction in opposing outer portions of the board substrate;

a sub-package mounted on the board substrate using the through vias and including chips; and a first sealant sealing the controller chip, the through vias, and the sub-package, wherein the sub-package includes a first stack structure disposed to one side of the controller chip and including vertically stacked chips, a second stack structure disposed to another side of the controller chip adjacent to the first stack structure in the first horizontal direction and including vertically stacked chips, and wherein the semiconductor package comprises a second sealant sealing the first stack structure and the second stack structure, a portion of the second sealant being between the first stack structure and the second stack structure along the first horizontal direction, and the portion of the first sealant being above the controller chip in a vertical direction that is perpendicular to the first horizontal direction.

18. The semiconductor package of claim 17, further comprising:

sub-package pads disposed on a lower surface of the sub-package and connected to the through vias, wherein chips of the first stack structure and chips of the second stack structure are connected to the sub-package pads through respective connecting wires.

19. The semiconductor package of claim 17, wherein the first stack structure and the second stack structure are symmetrical with respect to the controller chip, and chips of the first stack structure are vertically stacked in a staircase and chips of the second stack structure are vertically stacked in a staircase, such that chips of the first stack structure and chips of the second stack structure are more closely disposed in the first horizontal direction as the first stack structure and the second stack structure extend vertically upward.

20. The semiconductor package of claim 17, wherein the first stack structure and the second stack structure are symmetrical with respect to the controller chip, each of the first stack structure and the second stack structure is one of a one-layer tower structure and a two-layer tower structure, the one-layer tower structure has a staircase-type structure, and the two-layer tower structure includes a first tower and a second tower, wherein the first tower is a one-layer tower, and the second tower is a one-layer tower disposed on the first tower.

* * * * *